United States Patent
Maruyama

(10) Patent No.: US 11,187,982 B2
(45) Date of Patent: Nov. 30, 2021

(54) PHOTOSENSITIVE RESIN COMPOSITION, PHOTOSENSITIVE DRY FILM, AND PATTERN FORMING PROCESS

(71) Applicant: Shin-Etsu Chemical Co., Ltd., Tokyo (JP)

(72) Inventor: Hitoshi Maruyama, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 31 days.

(21) Appl. No.: 16/597,128

(22) Filed: Oct. 9, 2019

(65) Prior Publication Data

US 2020/0117089 A1    Apr. 16, 2020

(30) Foreign Application Priority Data

Oct. 15, 2018 (JP) .............................. JP2018-193949

(51) Int. Cl.
| | | |
|---|---|---|
| *G03F 7/075* | (2006.01) | |
| *G03F 7/30* | (2006.01) | |
| *G03F 7/38* | (2006.01) | |
| *G03F 7/085* | (2006.01) | |
| *G03F 7/40* | (2006.01) | |

(52) U.S. Cl.
CPC .......... *G03F 7/0757* (2013.01); *G03F 7/0751* (2013.01); *G03F 7/085* (2013.01); *G03F 7/30* (2013.01); *G03F 7/40* (2013.01); *G03F 7/38* (2013.01)

(58) Field of Classification Search
CPC ............. G03F 7/0757; G03F 7/30; G03F 7/38
See application file for complete search history.

(56) References Cited

U.S. PATENT DOCUMENTS

| | | | | |
|---|---|---|---|---|
| 5,258,426 | A | * | 11/1993 | Uchida ................ H01L 23/293 523/435 |
| 6,590,010 | B2 | | 7/2003 | Kato et al. |
| 7,785,766 | B2 | | 8/2010 | Kato et al. |
| 8,088,856 | B2 | * | 1/2012 | Shiobara ................ C08G 59/42 524/413 |
| 2016/0097974 | A1 | | 4/2016 | Asai et al. |
| 2016/0357105 | A1 | | 12/2016 | Asai et al. |
| 2016/0358833 | A1 | | 12/2016 | Soga et al. |
| 2018/0107115 | A1 | | 4/2018 | Asai et al. |
| 2018/0187010 | A1 | * | 7/2018 | Chisaka ................ C09D 183/16 |
| 2019/0049844 | A1 | * | 2/2019 | Maruyama ................ G03F 7/38 |

FOREIGN PATENT DOCUMENTS

| | | |
|---|---|---|
| EP | 1 186 624 A1 | 3/2002 |
| EP | 1 953 183 A2 | 8/2008 |
| JP | 2002-88158 A | 3/2002 |
| JP | 2008-184571 A | 8/2008 |
| JP | 2016-071355 A | 5/2016 |
| JP | 2018-062140 A | 4/2018 |

OTHER PUBLICATIONS

Extended European Search Report dated Nov. 25, 2019, issued in counterpart application No. 19195524.4. (6 pages).
Office Action dated Jun. 29, 2021, issued in counterpart JP application No. 2018-193949, with English translation. (5 pages).

* cited by examiner

*Primary Examiner* — John S Chu
(74) *Attorney, Agent, or Firm* — Westerman, Hattori, Daniels & Adrian, LLP

(57) ABSTRACT

A photosensitive resin composition comprising (A) a silicone resin containing an epoxy and/or phenolic hydroxyl group, (B) a photoacid generator, and (C) a cure promoter selected from diazabicycloundecene, diazabicyclononene, an organic salt of diazabicycloundecene derivative, and an organic salt of diazabicyclononene derivative is shelf stable. A photosensitive resin coating obtained therefrom may be processed to form a fine size pattern. The resin coating has improved film properties including chemical resistance, adhesion to substrates, mechanical properties, electric insulation, and copper migration resistance, and is thus fully reliable as an insulating protective film.

12 Claims, No Drawings

PHOTOSENSITIVE RESIN COMPOSITION, PHOTOSENSITIVE DRY FILM, AND PATTERN FORMING PROCESS

CROSS-REFERENCE TO RELATED APPLICATION

This non-provisional application claims priority under 35 U.S.C. § 119(a) on Patent Application No. 2018-193949 filed in Japan on Oct. 15, 2018, the entire contents of which are hereby incorporated by reference.

TECHNICAL FIELD

This invention relates to a photosensitive resin composition, photosensitive dry film, and pattern forming process.

BACKGROUND ART

In the prior art, photosensitive protective films for semiconductor chips and photosensitive insulating films for multilayer printed circuit boards are formed of photosensitive polyimide compositions, photosensitive epoxy resin compositions, photosensitive silicone compositions, and the like. As the photosensitive material applied for the protection of such substrates and circuits, Patent Document 1 discloses a photosensitive silicone composition having improved flexibility. This photosensitive silicone composition is curable at low temperature and forms a coating which is fully reliable with respect to moisture resistant adhesion and other properties, but is less resistant against chemicals such as photoresist strippers having a high dissolving power, typically N-methyl-2-pyrrolidone (NMP).

To overcome the problem, Patent Document 2 proposes a photosensitive silicone composition based on a silphenylene structure-bearing silicone polymer. This composition is improved in chemical resistance against photoresist strippers and the like, but still has the problem that the composition or a dry film thereof is less shelf-stable with a lapse of time, and when cured at low temperature, the composition is less resistant to copper migration. A further improvement of such resin compositions is desired.

CITATION LIST

Patent Document 1: JP-A 2002-088158 (U.S. Pat. No. 6,590,010, EP 1186624)
Patent Document 2: JP-A 2008-184571 (U.S. Pat. No. 7,785,766, EP 1953183)

DISCLOSURE OF INVENTION

An object of the invention is to provide a photosensitive resin composition which is shelf stable and forms a resin coating or film that can be readily processed to form a pattern, has improved film properties including adhesion to substrates for use in electronic parts and semiconductor chips and supports for use in circuit boards, and is thus reliable as a protective film for electric and electronic parts and a film for bonding substrates and especially resistant to copper migration. Another object is to provide a photosensitive dry film and a pattern forming process, using the composition.

The inventors have found that a photosensitive resin composition comprising (A) a silicone resin containing an epoxy and/or phenolic hydroxyl goup, (B) a photoacid generator, and (C) a cure promoter selected from diazabicycloundecene, diazabicyclononene, an organic salt having a diazabicycloundecene derivative as a cation species, and an organic salt having a diazabicyclononene derivative as a cation species has shelf stability and functions to provide a sufficient film-forming ability; that a photosensitive resin coating can be formed from the composition to a wide range of thickness, and that the photosensitive resin coating is readily processed to define a pattern, has improved film properties including adhesion to substrates, electronic parts and semiconductor chips, reliability as electrical/electronic part-protecting film or substrate-bonding film, and copper migration resistance, and is thus useful as a film for protecting electrical/electronic parts and a film for bonding substrates.

In one aspect, the invention provides a photosensitive resin composition comprising (A) a silicone resin containing an epoxy and/or phenolic hydroxyl group, (B) a photoacid generator, and (C) at least one cure promoter selected from diazabicycloundecene, diazabicyclononene, an organic salt having a diazabicycloundecene derivative as a cation species, and an organic salt having a diazabicyclononene derivative as a cation species.

In a preferred embodiment, the silicone resin (A) comprises recurring units having the formulae (a1) to (a4) and (b1) to (b4).

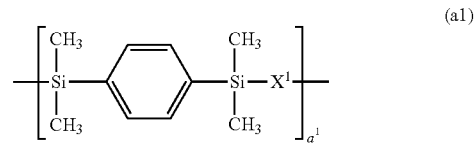
(a1)

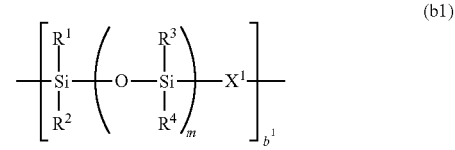
(b1)

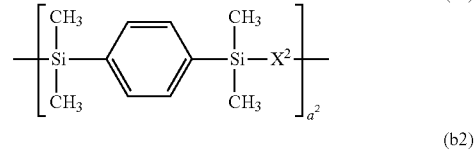
(a2)

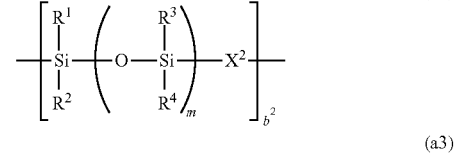
(b2)

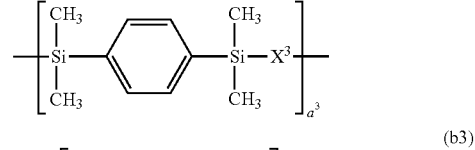
(a3)

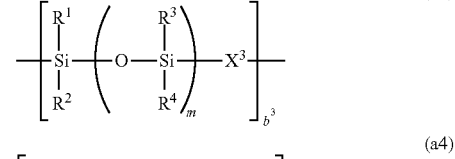
(b3)

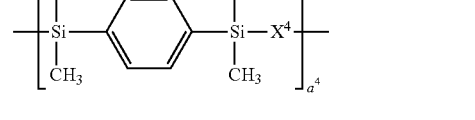
(a4)

-continued (b4)
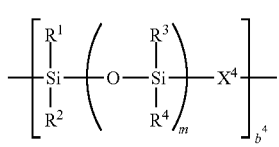

Herein $R^1$ to $R^4$ are each independently a $C_1$-$C_8$ monovalent hydrocarbon group, m is an integer of 1 to 600, $a^1$ to $a^4$ and $b^1$ to $b^4$ are numbers in the range: $0 \leq a^1 < 1$, $0 \leq a^2 < 1$, $0 \leq a^3 < 1$, $0 \leq a^4 < 1, 0 \leq b^1 < 1, 0 \leq b^2 < 1, 0 \leq b^3 < 1, 0 \leq b^4 < 1, 0 a^1 + a^2 + a^3 < 1$, $0 < b^1 + b^2 + b^3 < 1$, and $a^1 + a^2 + a^3 + a^4 + b^1 + b^2 + b^3 + b^4 = 1$.

$X^1$ is a divalent group having the formula (X1):

(X1)
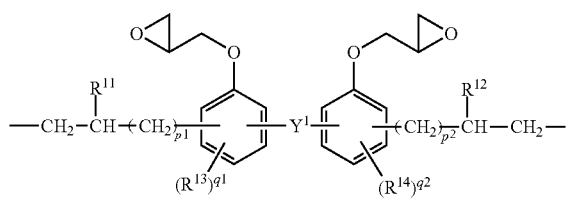

wherein $Y^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently $C_1$-$C_4$ alkyl or $C_1$-$C_4$ alkoxy, $p^1$ and $p^2$ are each independently an integer of 0 to 7, $q^1$ and $q^2$ are each independently an integer of 0 to 2.

$X^2$ is a divalent group having the formula (X2):

(X2)
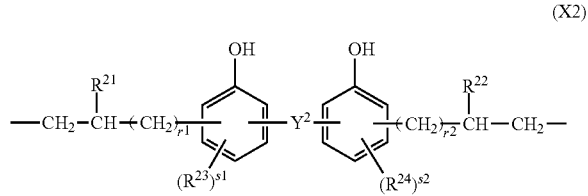

wherein $Y^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently $C_1$-$C_4$ alkyl or $C_1$-$C_4$ alkoxy, $r^1$ and $r^2$ are each independently an integer of 0 to 7, $s^1$ and $s^2$ are each independently, an integer of 0 to 2.

$X^3$ is a divalent group having the formula (X3):

(X3)
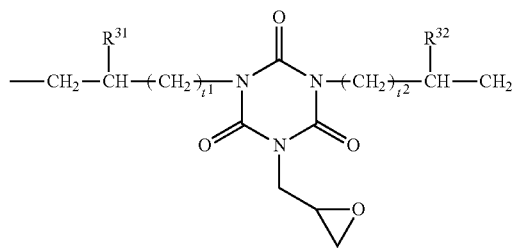

wherein $R^{31}$ and $R^{32}$ are each independently hydrogen or methyl, $t^1$ and $t^2$ are each independently an integer of 0 to 7.

$X^4$ is a divalent group having the formula (X4):

(X4)
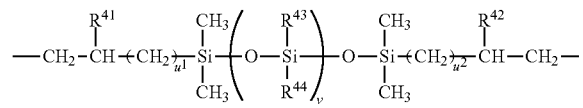

wherein $R^{41}$ and $R^{42}$ are each independently hydrogen or methyl, $R^{43}$ and $R^{44}$ are each independently a $C_1$-$C_8$ monovalent hydrocarbon group, $u^1$ and $u^2$ are each independently an integer of 0 to 7, v is an integer of 0 to 600.

The photosensitive resin composition may further comprise (D) a crosslinker. The crosslinker is preferably selected from the group consisting of melamine, guanamine, glycoluril and urea compounds having on the average at least two methylol and/or alkoxymethyl groups in the molecule, amino condensates modified with formaldehyde or formaldehyde-alcohol, phenol compounds having on the average at least two methylol or alkoxymethyl groups in the molecule, and epoxy compounds having on the average at least two epoxy groups in the molecule.

The photosensitive resin composition may further comprise (E) a solvent.

In another aspect, the invention provides a photosensitive resin coating obtained from the photosensitive resin composition defined above.

In a further aspect, the invention provides a photosensitive dry film comprising a support and the photosensitive resin coating defined above thereon.

In a still further aspect, the invention provides a pattern forming process comprising the steps of:
(i) coating the photosensitive resin composition defined above onto a substrate to form a photosensitive resin coating thereon,
(ii) exposing the photosensitive resin coating to radiation to define exposed and unexposed regions, and
(iii) developing the exposed resin coating in a developer to dissolve away the unexposed region of the resin coating and to form a pattern of the resin coating.

In a yet further aspect, the invention provides a pattern forming process comprising the steps of:
(i') using the photosensitive dry film defined above to form the photosensitive resin coating on a substrate,
(ii) exposing the photosensitive resin coating to radiation to define exposed and unexposed regions, and
(iii) developing the exposed resin coating in a developer to dissolve away the unexposed region of the resin coating and to form a pattern of the resin coating.

The pattern forming process may further comprise (iv) post-curing the patterned resin coating resulting from development step (iii) at a temperature of 100 to 250° C.

Typically, the photosensitive resin composition is used to form a protective film on an electrical or electronic part, or is used to form a layer for bonding two substrates.

Advantageous Effects of Invention

While the photosensitive resin composition is shelf stable, a photosensitive resin coating having a wide range of thickness may be formed therefrom. The resin coating may be processed in thick film form by the pattern forming process to form a fine size pattern having perpendicularity. The resin coating obtained from the photosensitive resin composition or photosensitive dry film has improved film properties including resistance against chemicals, typically photoresist strippers, adhesion to substrates, electronic parts, semiconductor chips, and supports for circuit boards, mechanical properties, electric insulation, and copper migration resistance, and is thus fully reliable as an insulating protective film. The resin coating is thus useful as a protective film-forming material for protecting electric/electronic parts (such as circuit boards, semiconductor chips and display units) and a film-forming material for bonding substrates.

DESCRIPTION OF PREFERRED EMBODIMENTS

As used herein, the notation (Cn-Cm) means a group containing from n to m carbon atoms per group.

Photosensitive Resin Composition

The invention provides a photosensitive resin composition comprising (A) a silicone resin containing an epoxy and/or phenolic hydroxyl group, (B) a photoacid generator, and (C) at least one cure promoter selected from diazabicycloundecene, diazabicyclononene, an organic salt having a diazabicycloundecene derivative as a cation species, and an organic salt having a diazabicyclononene derivative as a cation species.

(A) Silicone Resin

Component (A) is a silicone resin containing an epoxy group or a phenolic hydroxyl group or both. The silicone resin (A) is not particularly limited as long as it contains an epoxy and/or phenolic hydroxyl group. Preferably, the silicone resin comprises recurring units having the formulae (a1) to (a4) and (b1) to (b4), also referred to as recurring units (a1) to (a4) and (b1) to (b4), hereinafter.

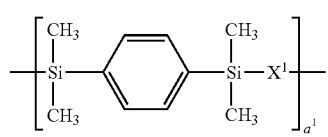
(a1)

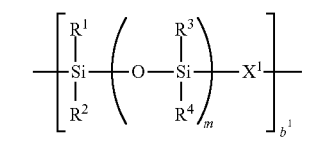
(b1)

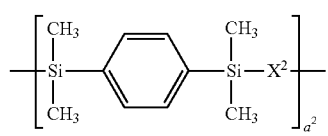
(a2)

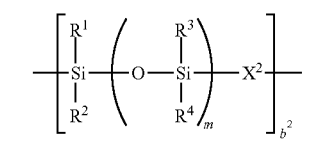
(b2)

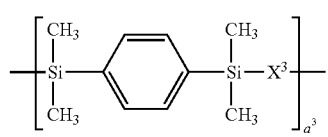
(a3)

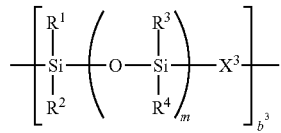
(b3)

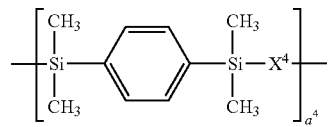
(a4)

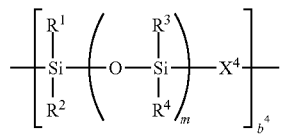
(b4)

Herein $R^1$ to $R^4$ are each independently a $C_1$-$C_8$, preferably $C_1$-$C_6$ monovalent hydrocarbon group. Suitable monovalent hydrocarbon groups include alkyl, cycloalkyl and aryl groups, and specifically, methyl, ethyl, propyl, hexyl, and structural isomers thereof, cyclohexyl and phenyl. Inter alia, methyl and phenyl are preferred for availability of reactants.

The subscript m is an integer of 1 to 600, preferably 1 to 400, more preferably 1 to 200.

In formulae (a1) and (b1), $X^1$ is a divalent group having the formula (X1).

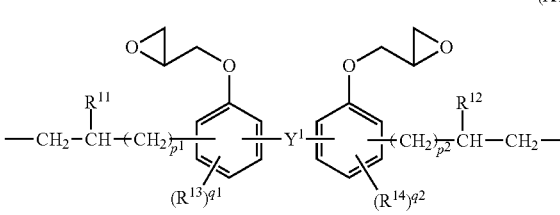
(X1)

In formula (X1) $Y^1$ is a single bond, methylene, propane-2,2-diyl, 1,1,1,3,3,3-hexafluoropropane-2,2-diyl or fluorene-9,9-diyl. $R^{11}$ and $R^{12}$ are each independently hydrogen or methyl. $R^{13}$ and $R^{14}$ are each independently a $C_1$-$C_4$ alkyl group or $C_1$-$C_4$ alkoxy group, $p^1$ and $p^2$ are each independently an integer of 0 to 7, $q^1$ and $q^2$ are each independently an integer of 0 to 2.

The alkyl group may be straight, branched or cyclic and examples thereof include methyl, ethyl, propyl, butyl, and structural isomers thereof. The alkoxy group may be straight, branched or cyclic and examples thereof include methoxy, ethoxy, propoxy, butoxy, and structural isomers thereof.

In formulae (a2) and (b2), $X^2$ is a divalent group having the formula (X2).

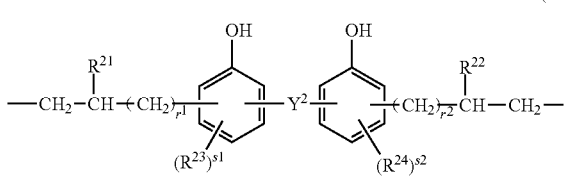
(X2)

In formula (X2), $Y^2$ is a single bond, methylene, propane-2,2-diyl, 1,1,1,3,3,3-hexafluoropropane-2,2-diyl or fluorene-9,9-diyl. $R^{21}$ and $R^{22}$ are each independently hydrogen or methyl. $R^{23}$ and $R^{24}$ are each independently a $C_1$-$C_4$ alkyl group or $C_1$-$C_4$ alkoxy group, $r^1$ and $r^2$ are each independently an integer of 0 to 7, $s^1$ and $s^2$ are each independently an integer of 0 to 2. Suitable alkyl and alkoxy groups are as exemplified above.

In formulae (a3) and (b3), $X^3$ is a divalent goup having the formula (X3).

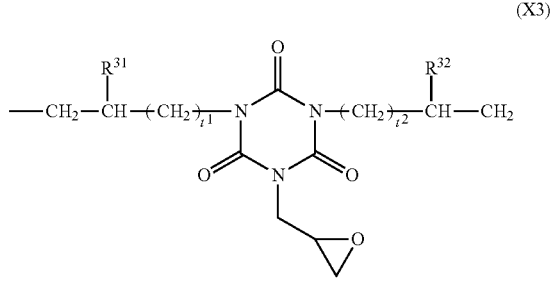
(X3)

In formula (X3), $R^{31}$ and $R^{32}$ are each independently hydrogen or methyl, $t^1$ and $t^2$ are each independently an integer of 0 to 7.

In formulae (a4) and (b4), $X^4$ is a divalent goup having the formula (X4).

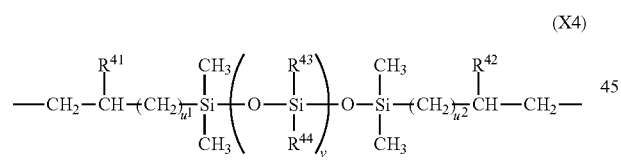
(X4)

In formula (X4), $R^{41}$ and $R^{42}$ are each independently hydrogen or methyl. $R^{43}$ and $R^{44}$ are each independently a $C_1$-$C_8$ monovalent hydrocarbon group, $u^1$ and $u^2$ are each independently an integer of 0 to 7, and $v$ is an integer of 0 to 600, preferably 0 to 400, more preferably 0 to 200. Suitable monovalent hydrocarbon groups are as exemplified above for $R^1$ to $R^4$.

The silicone resin preferably has a weight average molecular weight (Mw) of 3,000 to 500,000, more preferably 5,000 to 200,000. It is noted throughout the disclosure that Mw is measured by gel permeation chromatography (GPC) versus polystyrene standards using tetrahydrofuran (THF) as the elute.

The subscripts $a^1$ to $a^4$ and $b^1$ to $b^4$ are numbers in the range: $0 \leq a^1 < 1$, $0 \leq a^2 < 1$, $0 \leq a^3 < 1$, $0 \leq a^4 < 1$, $0 \leq b^1 < 1$, $0 \leq b^2 < 1$, $0 \leq b^3 < 1$, $0 \leq b^4 1$, $0 < a^1+a^2+a^3 < 1$, $0 < b^1+b^2+b^3 < 1$, and $a^1+a^2+a^3+a^4+b^1+b^2+b^3+b^4=1$; preferably $0 \leq a^1 \leq 0.8$, $0 \leq a^2 \leq 0.8$, $0 \leq a^3 \leq 0.8$, $0 \leq a^4 \leq 0.8$, $0 \leq b^1 \leq 0.95$, $0 \leq b^2 \leq 0.95$, $0 \leq b^3 \leq 0.95$, $0 b^4 \leq 0.95$, $0.05 \leq a^1+a^2+a^3 \leq 0.8$, $0.2 \leq b^1+b^2+b^3 \leq 0.95$, and $a^1+a^2+a^3+a^4+b^1+b^2+b^3+b^4=1$; more preferably $0 \leq a^1 0.7$, $0 \leq a^2 \leq 0.7$, $0 \leq a^3 \leq 0.7$, $0 \leq a^4 0.7$, $0 \leq b^1 \leq 0.9$, $0 \leq b^2 \leq 0.9$, $0 \leq b^3 \leq 0.9$, $0 \leq b^4 \leq 0.9$, $0.1 \leq a^1+a^2+a^3 \leq 0.7$, $0.3 \leq b^1+b^2+b^3 \leq 0.9$, and $a^1+a^2+a^3+a^4+b^1+b^2+b^3+b^4=1$.

In the silicone resin, individual recurring units may be arranged randomly or blockwise. Siloxane units in each recurring unit may be bonded randomly, or a plurality of blocks of siloxane units of identical type may be contained. The content of silicone (i.e., siloxane units) is preferably 30 to 80% by weight.

The silicone resin as component (A) functions to impart a sufficient film-forming ability to a photosensitive resin composition. A resin coating obtained from the photosensitive resin composition has improved adhesion to substrates and laminates, a pattern forming ability, crack resistance, and heat resistance.

Preparation of Silicone Resin

The silicone resin (A) may be prepared by addition polymerization of a compound having the formula (1), a compound having the formula (2), at least one of a compound having the formula (3), a compound having the formula (4), and a compound having the formula (5), and optionally, a compound having the formula (6), all shown below, in the presence of a metal catalyst.

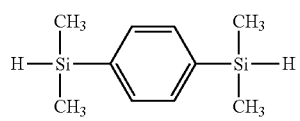
(1)

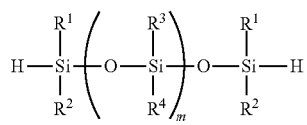
(2)

Herein $R^1$ to $R^4$ and m are as defined above.

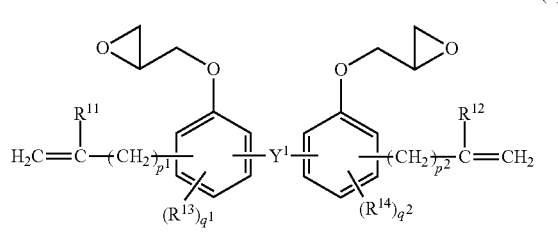
(3)

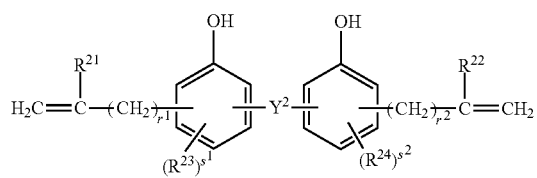
(4)

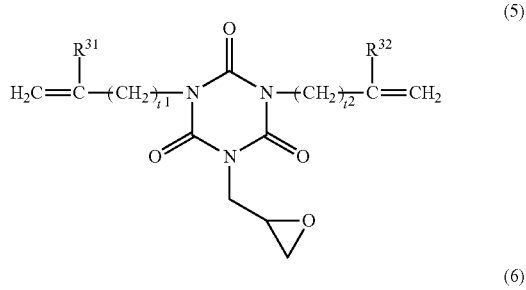

(5)

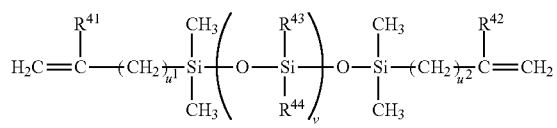

(6)

Herein $R^{11}$ to $R^{14}$, $R^{21}$ to $R^{24}$, $R^{31}$, $R^{32}$, $R^{41}$ to $R^{44}$, $Y^1$, $Y^2$, $p^1$, $p^2$, $q^1$, $q^2$, $r^1$, $r^2$, $s^1$, $s^2$, $t^1$, $t^2$, $u^1$, $u^2$ and v are as defined above.

Examples of the metal catalyst used herein include platinum group metals alone such as platinum (including platinum black), rhodium and palladium; platinum chlorides, chloroplatinic acids and chloroplatinates such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot xH_2O$, wherein x is preferably an integer of 0 to 6, more preferably 0 or 6; alcohol-modified chloroplatinic acids as described in U.S. Pat. No. 3,220,972; chloroplatinic acid-olefin complexes as described in U.S. Pat. Nos. 3,159,601, 3,159,662 and 3,775,452; supported catalysts comprising platinum group metals such as platinum black and palladium on supports of alumina, silica and carbon; rhodium-olefin complexes; chloro-tris(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1% by weight, more preferably 0.01 to 0.1% by weight of platinum group metal based on the total weight of the compounds (exclusive of the solvent) used in the addition polymerization.

In the addition polymerization, a solvent may be used, if desired. Suitable solvents are hydrocarbon solvents such as toluene and xylene. The reaction temperature is preferably in a range of 40 to 150° C., more preferably 60 to 120° C., within which the catalyst is not deactivated and the polymerization can be completed within a short time. The polymerization time varies with the type and amount of the resulting resin. It is preferably about 0.5 to about 100 hours, more preferably about 0.5 to about 30 hours for preventing moisture entry into the polymerization system. After the completion of reaction, the solvent (if used) is distilled off, whereupon the silicone resin (A) is obtained.

The reaction procedure is not particularly limited. Where a compound having formula (1), a compound having formula (2), at least one of compounds having formulae (3), (4), and (5), and an optional compound having formula (6) are to be reacted, the preferred procedure is by first adding the at least one of compounds having formulae (3), (4), and (5) and the optional compound having formula (6) to a solvent, heating, adding a metal catalyst to the mixture, and then adding the compounds having formulae (1) and (2) dmopwise over 0.1 to 5 hours.

In the addition polymerization, the reactants are preferably combined in such amounts that a molar ratio of the total amount of hydrosilyl groups in the compounds having formulae (1) and (2) to the total amount of alkenyl groups in the at least one of compounds having formulae (3), (4), and (5) and the optional compound having formula (6) may range from 0.67 to 1.67, more preferably from 0.83 to 1.25. The Mw of the resulting resin can be controlled using a molecular weight control agent such as a monoallyl compound (e.g., o-allylphenol), monohydrosilane (e.g., triethylhydrosilane) or monohydrosiloxane.

(B) Photoacid Generator

Component (B) is a photoacid generator (PAG), which is not particularly limited as long as it is decomposed to generate an acid upon exposure to light. The PAG is typically a compound capable of generating an acid upon exposure to light with a wavelength of 190 to 500 nm. Since the photosensitive resin composition of the invention is highly compatible with the PAG, the PAG may be selected from a wide variety of such compounds. Typical PAGs include onium salts, diazomethane derivatives, glyoxime derivatives, β-ketosulfone derivatives, disulfone derivatives, nitrobenzyl sulfonate derivatives, sulfonic acid ester derivatives, imido-yl sulfonate derivatives, oxime sulfonate derivatives, imino sulfonate derivatives, and triazine derivatives.

Suitable onium salts include sulfonium salts having the following formula (B1) and iodonium salts having the following formula (B2).

(B1)

(B2)

In formulae (B1) and (B2), $R^{101}$ to $R^{105}$ are each independently a $C_1$-$C_{12}$ alkyl group, $C_6$-$C_{12}$ aryl group, or $C_7$-$C_{12}$ aralkyl group, which may have a substituent. $A^-$ is a non-nucleophilic counter ion.

The alkyl group may be straight, branched or cyclic, and examples thereof include methyl, ethyl, n-propyl, isopropyl, cyclopropyl, n-butyl, isobutyl, sec-butyl, tert-butyl, cyclobutyl, n-pentyl, cyclopentyl, cyclohexyl, norbornyl and adamantyl. Exemplary aryl groups include phenyl, naphthyl and biphenylyl. Exemplary aralkyl goups include benzyl and phenethyl. Examples of the substituent include oxo, straight, branched or cyclic $C_1$-$C_{12}$ alkoxy groups, straight, branched or cyclic $C_1$-$C_{12}$ alkyl groups, $C_6$-$C_{24}$ aryl groups, $C_7$-$C_{25}$ aralkyl groups, $C_6$-$C_{24}$ aryloxy groups, and $C_6$-$C_{24}$ arylthio groups.

Preferably $R^{101}$ to $R^{105}$ are selected from optionally substituted alkyl groups such as methyl, ethyl, propyl, butyl, cyclohexyl, norbornyl, adamantyl, 2-oxocyclohexyl; optionally substituted aryl groups such as phenyl, naphthyl, biphenylyl, o-, m- or p-methoxyphenyl, ethoxphenyl, m- or p-tert-butoxyphenyl, 2-, 3- or 4-methylphenyl, ethylphenyl, 4-tert-butylphenyl, 4-butylphenyl, dimethylphenyl, terphenylyl, biphenylyloxyphenyl, and biphenylylthiophenyl; and optionally substituted aralkyl groups such as benzyl and phenethyl. Inter alia, optionally substituted aryl groups and optionally substituted aralkyl groups are more preferred.

Examples of the non-nucleophilic counter ion include halide ions such as chloride and bromide; fluoroalkonesulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkanesulfonate ions such as mesylate and butanesulfonate; fluoroalkanesulfonimide ions such as trifluoromethanesulfonimide; fluoroalkanesulfonylmethide ions such as tris(trifluoromethanesulfonyl)methide; and borate ions such as tetrakisphenylborate and tetrakis(pentafluorophenyl)borate.

Exemplary diazomethane derivatives are compounds of the following formula (B3).

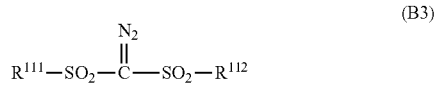

In formula (B3), $R^{111}$ and $R^{112}$ are each independently a $C_1$-$C_{12}$ alkyl or haloalkyl group, optionally substituted $C_6$-$C_{12}$ aryl group, or $C_7$-$C_{12}$ aralkyl group.

The alkyl group may be straight, branched or cyclic and examples thereof are as exemplified above for $R^{101}$ to $R^{105}$. Exemplary haloalkyl groups include trifluoromethyl, 1,1,1-trifluoroethyl, 1,1,1-trichloroethyl, and nonafluorobutyl.

Examples of the optionally substituted aryl groups include phenyl; alkoxyphenyl groups such as 2-, 3- or 4-methoxyphenyl, 2-, 3- or 4-ethoxyphenyl, 3- or 4-tert-butoxyphenyl; alkylphenyl groups such as 2-, 3- or 4-methylphenyl, ethylphenyl, 4-tert-butylphenyl, 4-butylphenyl, and dimethylphenyl; and haloaryl groups such as fluorophenyl, chlorophenyl, and 1,2,3,4,5-pentafluorophenyl. Exemplary aralkyl groups include benzyl and phenethyl.

Suitable glyoxime derivatives are compounds having the formula (B4).

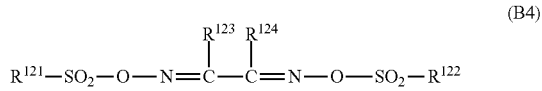

In formula (B4), $R^{121}$ to $R^{124}$ are each idependently a $C_1$-$C_{12}$ alkyl or haloalkyl group, optionally substituted $C_6$-$C_{12}$ aryl group, or $C_7$-$C_{12}$ aralkyl group. $R^{123}$ and $R^{124}$ may bond together to form a ring with the carbon atom to which they are attached. In the case of ring formation, a combination of $R^{123}$ and $R^{124}$ is a $C_1$-$C_{12}$ straight or branched alkylene group.

Examples of the alkyl, haloalkyl, optionally substituted aryl, and aralkyl groups are as exemplified above for $R^{111}$ and $R^{112}$. Suitable straight or branched alkylene groups include methylene, ethylene, propylene, butylene and hexylene.

Exemplary onium salts include diphenyliodonium trifluoromethanesulfonate, (p-tert-butoxyphenyl)phenyliodonium trifluoromethanesulfonate, diphenyliodonium p-toluenesulfonate, (p-tert-butoxyphenyl)phenyliodonium p-toluenesulfonate, triphenylsulfonium trifluoromethanesulfonate, (p-tert-butoxyphenyl)diphenylsulfonium trifluoromethanesulfonate, bis(p-tert-butoxyphenyl)phenylsulfonium trifluoromethanesulfonate, tris(p-tert-butoxyphenyl)sulfonium trifluoromethanesulfonate, triphenylsulfonium p-toluenesulfonate (p-tert-butoxyphenyl)diphenylsulfonium p-toluenesulfonate, bis(p-tert-butoxyphenyl)phenylsulfonium p-toluenesulfonate, tris(p-tert-butoxyphenyl)sulfonium p-toluenesulfonate, triphenylsulfonium nonafluorobutanesulfonate, triphenylsulfonium butanesulfonate, trimethylsulfonium trifluoromethanesulfonate, trimethylsulfonium p-toluenesulfonate, cyclohexylmethyl(2-oxocyclohexyl)sulfonium trifluoromethanesulfonate, cyclohexylmethyl(2-oxocyclohexyl)sulfonium p-toluenesulfonate, dimethylphenylsulfonium trifluoromethanesulfonate, dimethylphenylsulfonium p-toluenesulfonate, dicyclohexylphenylsulfonium trifluoromethanesulfonate, dicyclohexylphenylsulfonium p-toluenesulfonate, bis(4-tert-butylphenyl)iodonium hexafluorophosphate, diphenyl(4-thiophenoxyphenyl)sulfonium hexafluoroantimonate, [4-(4-biphenylylthio)phenyl]-4-biphenylylphenylsulfonium tris(trifluoromethanesulfonyl)methide, triphenylsulfonium tetrakis(fluorophenyl)borate, tris[4-(4-acetylphenyl)thiophenyl]sulfonium tetrakis(fluorophenyl)borate, triphenylsulfonium tetrakis(pentafluorophenyl)borate, and tris[4-(4-acetylphenyl)thiophenyl]sulfonium tetrakis(pentafluorophenyl)borate.

Exemplary diazomethane derivatives include bis(benzenesulfonyl)diazomethane bis(p-toluenesulfonyl)diazomethane, bis(xylenesulfonyl)diazomethane, bis(cyclohexylsulfonyl)diazomethane, bis(cyclopentylsulfonyl)diazomethane, bis(n-butylsulfonyl)diazomethane, bis(isobutylsulfonyl)diazomethane, bis(sec-butylsulfonyl)diazomethane, bis(n-propylsulfonyl)diazomethane, bis(isopropylsulfonyl)diazomethme, bis(tert-butylsulfonyl)diazomethane, bis(n-pentylsulfonyl)diazonmethane, bis(isopentylsulfonyl)diazmethane, bis(sec-pentylsulfonyl)diazomethane, bis(tert-pentylsulfonyl)diazomethane, 1-cyclohexylsulfonyl-1-(tert-butylsulfonyl)diazomethane, 1-cyclohexylsulfonly-1-(tert-pentylsulfonly)diazomethane, and 1-tert-pentylsulfonyl-1-(tert-butylsulfonyl)diazomethane.

Exemplary glyoxime derivatives include bis-O-(p-toluenesulfonyl)-α-dimethylglyoxime, bis-O-(p-toluenesulfonyl)-α-diphenylglyoxime, bis-O-(p-toluenesulfonyl)-α-dicyclohexylglyoxime, bis-O-(p-toluenesulfonyl)-2,3-pentanedioneglyoxime, bis-O-(p-toluenesulfonyl)-2-methyl-3,4-pentanedioneglyoxime, bis-O-(n-butanesulfonyl)-α-dimethylglyoxime, bis-O-(n-butanesulfonyl)-α-diphenylglyoxime, bis-O-(n-butanesulfonyl)-α-dicyclohexylglyoxime, bis-O-(n-butanesulfonyl)-2,3-pentanedioneglyoxime, bis-O-(n-butanesulfonyl)-2-methyl-3,4-pentanedioneglyoxime, bis-O-(methanesulfonyl)-α-dimethylglyoxime, bis-O-(trifluoromethanesulfonyl)-α-dimethylglyoxime, bis-O-(1,1,1-trifluoroethanesulfonyl)-α-dimethylglyoxime bis-O-(tert-butanesulfonyl)-α-dimethylglyoxime, bis-O-(perfluorooctanesulfonyl)-α-dimethylglyoxime, bis-O-(cyclohexanesulfonyl)-α-dimethylglyoxime, bis-O-(benzenesulfonyl)-α-dimethylglyoxime, bis-O-(p-fluorobenzenesulfonyl)-α-dimethylglyoxime, bis-O-(p-tert-butylbenenesulfonyl)-α-dimethylglyoxime, bis-O-(xylenesulfonyl)-α-dimethylglyoxime, and bis-O-(camphorsulfonyl)-α-dimethylglyoxime.

Exemplary β-ketosulfone derivatives include 2-cyclohexylcarbonyl-2-(p-toluenesulfonyl)propane and 2-isopropylcarbonyl-2-(p-tolueuesulfonyl)propane.

Exemplary disulfone derivatives include diphenyl disulfone and dicyclohexyl disulfone.

Exemplary nitrobenzyl sulfonate derivatives include 2,6-dinitrobenzyl p-toluenesulfonate and 2,4-dinitrobenzyl p-toluenesulfonate;

Exemplary sulfonic acid ester derivatives include 1,2,3-tris(methanesulfonyloxy)benzene, 1,2,3-tris(trifluoromethanesulfonyloxy)benzene, and 1,2,3-tris(p-toluenesulfonyloxy)benzene.

Exemplary imido-yl sulfonate derivatives include phthalimidoyl triflate, phthalimidoyl tosylate, 5-norbornene-2,3-dicarboxyimidoyl triflate, 5-norbornene-2,3-dicarboxyimidoyl tosylate, 5-norbornene-2,3-dicarboxyimidoyl n-butylsulfonate, and N-trifluoromethylsulfonyloxynaphthylimide.

Typical of the oxime sulfonate derivative is α-(benzenesulfoniumoxyimino)-4-methylphenylacetonitrile.

Also included are iminosulfonate derivatives such as (5-(4-methylphenyl)sulfonyloxyimino-5H-thiophen-2-ylidene)-(2-methylphenyl)acetonitrile and (5-(4-(4-methylphenylsulfonyloxy)phenylsulfonyloxyimino)-5H-thiophen-2-ylidene)-(2-methylphenyl)acetonitrile, as well as 2-methyl-2-[(4-methylphenyl)sulfonyl]-1-[(4-methylthio)phenyl]-1-propane.

As the PAG, the above-exemplified onium salts are preferred, and the above-exemplified sulfonium salts are more preferred.

From the standpoint of photo-cure, the PAG (B) is preferably used in an amount of 0.05 to 20 parts by weight, and more preferably 0.05 to 5 parts by weight per 100 parts by weight of component (A). When the amount of the PAG is at least 0.05 part, it may generate a sufficient amount of acid for crosslinking reaction to proceed. As long as the amount of the PAG is up to 20 parts, any increase of the light absorption by the PAG itself is prevented and a lowering of transparency is avoided. The PAGs may be used alone or in admixture of two or more.

(C) Cure Promoter

Component (C) is a cure promoter which is at least one compound selected from diazabicycloundecene, diazabicyclononene, an organic salt having a diazabicycloundecene derivative as a cation species, and an organic salt having a diazabicyclononene derivative as a cation species.

The cure promoter acts to promote cure in the PEB and post-cure steps. A photosensitive resin composition, to which the cure promoter defined herein is added, remains shelf stable, exerts a sufficient crosslinking reaction-promoting effect and forms a cured coating having electrical insulation and copper migration resistance, that is, quite high reliability as insulating protective film.

Although the organic salt is not particularly limited, triphenylborate, p-toluenesulfonate, phenol, octylate, and o-phthalate salts are suitable.

The cure promoter (C) is preferably used in an amount of 0.01 to 10 parts by weight, and more preferably 0.05 to 5 parts by weight per 100 parts by weight of component (A). At least 0.01 part by weight of component (C) ensures curability. As long as the amount of component (C) is up to 10 parts by weight, component (C) remains compatible with component (A), eliminating any loss of transparency. The cure promoter may be used alone or in admixture of two or more.

(D) Crosslinker

Preferably the photosensitive resin composition may further comprise (D) a crosslinker. Since the crosslinker undergoes condensation reaction with phenolic hydroxyl groups or alkoxy groups $R^{13}$, $R^{14}$, $R^{23}$ or $R^{24}$ in component (A), it functions to facilitate pattern formation and to increase the strength of the cured composition.

Preferably, the crosslinker is selected from nitrogen-containing compounds such as melamine, guanamine, glycoluril and urea compounds, having on the average at least two methylol and/or alkoxymethyl groups in the molecule, amino condensates modified with formaldehyde or formaldehyde-alcohol, phenol compounds having on the average at least two methylol or alkoxymethyl groups in the molecule, and epoxy compounds having on the average at least two epoxy groups in the molecule.

The melamine compound preferably has the formula (D1).

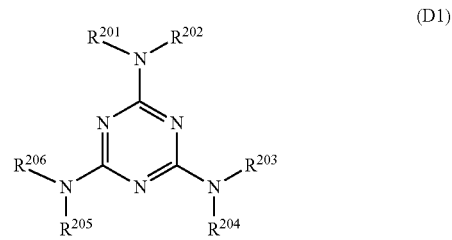

In formula (D1), to $R^{201}$ to $R^{206}$ are each independently a methylol group, $C_2$-$C_5$ alkoxymethyl group, or hydrogen, at least one of $R^{201}$ to $R^{206}$ is methylol alkoxymethyl. Suitable alkoxymethyl groups include methoxymethyl and ethoxymethyl.

Examples of the melamine compound having formula (D1) include trimethoxymethylmonomethylolmelamine, dimethoxymethylmonomethylolmelamine, trimethylolmelamine, hexamethylolmelamine, hexamethoxymethylmelamine, and hexaethoxymethylmelamine.

The melamine compound having formula (D1) may be prepared, for example, by modifying a melamine monomer with formaldehyde into a methylol form in a well-known manner, and optionally, further modifying it with an alcohol into an alkoxy form. The alcohols used herein are preferably lower alcohols, for example, alcohols having 1 to 4 carbon atoms.

Suitable guanamine compounds include tetramethylolguanamine, tetramethoxymethylguanamine and tetramethoxyethylguanamine. Suitable glycoluril compounds include tetramethylolglycoluril and tetrakis(methoxymethyl)glycoluril. Suitable urea compounds include tetramethylolurea, tetramethoxymethylurea, tetramethoxyethylurea, tetraethoxymethylurea, and tetrapropoxymethylurea.

Examples of the amino condensate modified with formaldehyde or formaldehyde-alcohol include melamine condensates modified with formaldehyde or formaldehyde-alcohol, and urea condensates modified with formaldehyde or formaldehyde-alcohol.

The modified melamine condensates are obtained, for example, by effecting addition polycondensation of a modified melamine having formula (D1) or an oligomer (e.g., dimer or timer) thereof with formaldehyde until a desired molecular weight is reached. The addition polycondensation may be performed by any prior art well-known methods. The modified melamine having formula (D1) may be used alone or in, admixture.

Examples of the urea condensate modified with formaldehyde or formaldehyde-alcohol include methoxymethylated urea condensates, ethoxymethylated urea condensates, and propoxymethylated urea condensates.

The modified urea condensates are prepared, for example, by modifying a urea condensate having a desired molecular weight with formaldehyde into a methylol form in a well-known manner, and optionally, further modifying it with an alcohol into an alkoxy form.

Examples of the phenol compound having on the average at least two methylol or alkoxymethyl groups in the molecule include (2-hydroxy-5-methyl)-1,3-benzenedimethanol and 2,2',6,6'-tetramethoxymethylbisphenol A.

Examples of the epoxy compound having on the average at least two epoxy groups in the molecule include bisphenol epoxy resins such as bisphenol A epoxy resins and bisphenol F epoxy resins, novolak epoxy resins such as phenol novolak epoxy resins and cresol novolak epoxy resins, triphenol alkane epoxy resins, biphenyl epoxy resins, dicyclopentadiene-modified phenol novolak epoxy resins, phenol aralkyl epoxy resins, biphenyl aralkyl epoxy resins, naphthalene ring-containing epoxy resins, alycidyl ester epoxy resins, cycloaliphatic epoxy resins, and heterocyclic epoxy resins.

When used, the crosslinker (D) is added in an amount of preferably 0.5 to 50 parts, and more preferably 1 to 30 parts by weight per 100 parts by weight of component (A). At least 0.5 part of component (D) ensures sufficient cure upon light exposure. As long as the amount of component (D) is up to 50 parts, the proportion of component (A) in the resin composition is not reduced, allowing the cured composition to exert its effects to the full extent. The crosslinkers may be used alone or in admixture.

(E) Solvent

To the photosensitive resin composition, (E) a solvent may be added. The solvent (E) used herein is not particularly limited as long as the foregoing components and other additives are dissolvable or dispersible therein. Organic solvents are preferred because the components are effectively dissolvable.

Illustrative, non-limiting, examples of the organic solvent include ketones such as cyclohexanone, cyclopentanone and methyl-2-n-pentylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate (PGMEA), propylene glycol monomethyl ether acetate, ethyl lactate, ethyl pyruvate, butyl acetate, methyl 3-methoxypropionate, ethyl 3-ethoxypropionate, tert-butyl acetate, tert-butyl propionate, and propylene glycol mono-tert-butyl ether acetate, and γ-butyrolactone. Of these solvents, preferred are ethyl lactate, cyclohexanone, cyclopentanone, PGMEA, γ-butyrolactone, and mixtures thereof, in which the PAG is most soluble. These solvents may be used alone or in combinations of two or more.

When the solvent is used, it is preferred from the standpoints of compatibility and viscosity of the resin composition that the solvent (E) be added in an amount of 50 to 2,000 parts, more preferably 50 to 1,000 parts, and especially 50 to 100 parts by weight per 100 parts by weight of components (A), (B) and (C) combined.

Other Additives

Besides the aforementioned components, the photosensitive resin composition may contain other additives, for example, surfactants which are commonly used for improving coating properties, and silane coupling agents.

Preferred surfactants are nonionic surfactants, for example, fluorochemical surfactants such as perfluoroalkyl polyoxyethylene ethanols, fluorinated alkyl esters, perfluoroalkylamine oxides, and fluorinated organosiloxane compounds. These surfactants are commercially available. Illustrative examples include Fluorad® FC-430 from 3M, Surflon® S-141 and S-145 from AGC Seimi Chemical Co., Ltd., Unidyne® DS-401, DS-4031, and DS-451 from Daikin Industries Ltd., Megaface® F-8151 from DIC Corp., and X-70-093 from Shin-Etsu Chemical Co., Ltd. Preferred surfactants are Fluorad FC-430 and X-70-093. When used, the amount of the surfactant is preferably 0.05 to 1 part by weight per 100 parts by weight of component (A).

Inclusion of a silane coupling agent is effective for enhancing the adhesion of the resin composition to adherends. Suitable silane coupling agents include epoxy silane coupling agents and aromatic aminosilane coupling agents. The silane coupling agent may be used alone or in admixture. Although the amount of the silane coupling agent used is not particularly limited, the amount of the silane coupling agent, when used, is preferably 0.01 to 5% by weight of the resin composition.

The photosensitive resin composition may be prepared by any conventional methods, for example, by stirring and mixing the components, and optionally passing the mixture through a filter to remove solids.

The photosensitive resin composition is advantageously used, for example, as film-forming material for semiconductor chip protective film, interconnection protective film, coverlay film, solder mask, and TSV dielectric film, and bonding agent between substrates in 3D laminates.

Pattern Forming Process

Another embodiment of the invention is a pattern forming process using the photosensitive resin composition defined above, the process comprising the steps of:

(i) coating the photosensitive resin composition onto a substrate to form a photosensitive resin coating thereon, (ii) exposing the photosensitive resin coating to radiation to define exposed and unexposed regions, and (iii) developing the exposed resin coating in a developer to dissolve away the unexposed region of the resin coating and to form a pattern of the resin coating.

First, in step (i), the photosensitive resin composition is coated onto a substrate to form a photosensitive resin coating thereon. Examples of the substrate include silicon wafers, TSV silicon wafers, silicon wafers which have been thinned by back side polishing, plastic substrates, ceramic substrates, and substrates having a metal coating of Ni or Au wholly or partly on the surface by ion sputtering or plating. Substrates having raised and depressed portions are also acceptable.

The coating technique may be any well-known technique, for example, dipping, spin coating, roll coating or the like. The coating weight may be selected as appropriate for a particular purpose, preferably so as to form a photosensitive resin coating having a thickness of 0.1 to 200 μm, more preferably 1 to 150 μm.

A pre-wetting technique of dispensing a solvent dropwise on a substrate prior to coating of the resin composition may be employed for the purpose of making the coating thickness on the substrate more uniform. The type and amount of the solvent dispersed dropwise may be selected for a particular purpose. For example, alcohols such as isopropyl alcohol (IPA), ketones such as cyclohexanone, and glycols such as propylene glycol monomethyl ether are preferred. The solvent used in the photosensitive resin composition may also be used.

At this point, the coating may be prebaked to volatilize off the solvent and the like, if necessary, for efficient photo-cure reaction. Prebake may be performed, for example, at 40 to 140° C. for 1 minute to about 1 hour.

Next, in step (ii), the photosensitive resin coating is exposed to radiation to define exposed and unexposed regions. The exposure radiation is preferably of wavelength 10 to 600 nm, more preferably 190 to 500 nm. Examples of radiation in the wavelength range include radiation of various wavelengths from radiation-emitting units, specifically UV radiation such as g-line, h-line or i-line, and deep UV (248 nm, 193 nm). Among these, radiation of wavelength 248 to 436 nm is preferred. An appropriate exposure dose is 10 to 10,000 mJ/cm$^2$.

Exposure may be made through a photomask. The photomask may be, for example, one perforated with a desired pattern. Although the material of the photomask is not particularly limited, a material capable of shielding radiation in the above wavelength range is preferred. Typically a mask having a light-shielding film of chromium is used.

The next step may be post-exposure bake (PEB) which is effective for enhancing development sensitivity. PEB is preferably performed at 40 to 150° C. for 0.5 to 10 minutes. The exposed region of the resin coating is crosslinked during PEB to form an insolubilized pattern which is insoluble in an organic solvent as developer.

The exposure or PEB is followed by the step (iii) of developing the exposed resin coating in a developer to dissolve away the unexposed region of the resin coating and to form a pattern of the resin coating. The preferred developers are organic solvents including alcohols such as IPA, ketones such as cyclohexanone, and glycols such as propylene glycol monomethyl ether. The solvent used in the photosensitive resin composition is also useful. Development is effected in a conventional manner, for example, by dipping the exposed coating in the developer. The development is followed by washing, rinsing and drying if necessary. In this way, a resin coating having the desired pattern is obtained.

In step (iv), the patterned coating may be post-cured in an oven or hot plate at a temperature of preferably 100 to 250° C., more preferably 150 to 220° C. The photosensitive resin composition ensures that a resin coating having improved film properties is obtained from post-cure even at a relatively low temperature around 200° C. The post-cure temperature of 100 to 250° C. is effective for increasing the crosslinking density of the resin coating and removing any residual volatile matter. The resulting coating has augmented adhesion to substrates, heat resistance, mechanical strength, good electric properties, and bond strength. The post-cure time is preferably 10 minutes to 10 hours, more preferably 10 minutes to 3 hours. The resin coating as post-cured has a thickness of 1 to 200 μm, preferably 5 to 50 μm.

Although the pattern forming process has been described, it is sometimes unnecessary to form a pattern. When it is simply desired to form a uniform film, for example, the same process as above may be followed except that in step (ii), the resin coating is exposed to radiation of suitable wavelength directly, i.e., without the photomask.

Substrate Bonding Method

The photosensitive resin composition may be used as an adhesive (or bonding agent) for bonding two substrates. The substrate bonding method may be a method of joining a first substrate having a coating of the resin composition formed thereon to a second substrate. One or both of the first substrate having a resin coating and the second substrate may have been cut into a chip such as by dicing. The preferred bonding conditions include a temperature of 50 to 200° C. and a time of 1 to 60 minutes. Any desired bonding units may be used, for example, a wafer bonder for bonding wafers under reduced pressure and under a certain load, or a flip chip bonder for performing chip-wafer or chip-chip bonding. The bond layer between substrates may be subjected to post-cure treatment into a permanent bond having augmented bond strength.

The thus joined or bonded substrates may be post-cured under the same conditions as in the above step (iv), for thereby increasing the crosslinking density of the resin coating to enhance substrate bonding force. It is noted that crosslinking reaction occurs by the heat during bonding. Since this crosslinking reaction is not accompanied with side reaction entailing degassing, no bonding voids are induced when the photosensitive resin composition is used as the substrate bonding agent.

Photosensitive Dry Film

A further embodiment of the invention is a photosensitive dry film comprising a support film and the photosensitive resin coating thereon.

The photosensitive film (support film+resin coating) is solid, and the photosensitive resin coating contains no solvent. This eliminates the risk that bubbles resulting from volatilization of solvent are left within the resin coating and between the resin coating and the rugged substrate surface. It is preferred from the standpoints of planarity, step coverage, and substrate lamination spacing that the photosensitive resin coating have a thickness of 5 to 200 μm, more preferably 10 to 100 μm.

Furthermore, the viscosity and fluidity of the photosensitive resin coating are closely correlated. As long as the photosensitive resin coating has a proper range of viscosity, it exhibits a sufficient fluidity to fill deeply even in a narrow gap or it softens to enhance the adhesion to the substrate. Accordingly, from the standpoint of fluidity, the photosensitive resin coating should preferably have a viscosity in the range of 10 to 5,000 Pa·s, more preferably 30 to 2,000 Pa·s, and even more preferably 50 to 300 Pa·s at a temperature of 80 to 120° C. It is noted that the viscosity is measured by a rotational viscometer.

The photosensitive dry film has the advantage that when tightly attached to a substrate having asperities on its surface, the photosensitive resin coating is coated so as to conform to the asperities, achieving high planarity. Since the photosensitive resin composition is characterized by low viscoelasticity, higher planarity is achievable. Further, when the photosensitive resin coating is brought in close contact with the substrate in a vacuum environment, the generation of gaps therebetween is effectively inhibited.

The photosensitive dry film may be manufactured by coating the photosensitive resin composition to a support and drying the resin composition into a resin coating. An apparatus for manufacturing the photosensitive dry film may be a film coater commonly used in the manufacture of pressure-sensitive adhesive products. Suitable film coaters include, for example, a comma coater, comma reverse coater, multiple coater, die coater, lip coater, lip reverse coater, direct gravure coater, offset gravure coater, three roll bottom reverse coater, and four roll bottom reverse coater.

The support film is unwound from a supply roll in the film coater, passed across the head of the film coater where the photosensitive resin composition is coated onto the support film to the predetermined buildup, and then moved through a hot air circulating oven at a predetermined temperature for a predetermined time, where the photosensitive resin coating is dried on the support film. Thereafter, the support film having the photosensitive resin coating thereon and a protective film which is unwound from another supply roll in the film coater are passed across a laminate roll under a predetermined pressure whereby the protective film is bonded to the photosensitive resin coating on the support film. Then the laminate is wound up on a take-up shaft in the film coater. Preferably, the oven temperature is 25 to 150° C., the pass time is 1 to 100 minutes, and the bonding pressure is 0.01 to 5 MPa.

The support film used in the photosensitive dry film may be a single film or a multilayer film consisting of a plurality of stacked polymer layers. Examples of the film material include synthetic resins such as polyethylene, polypropylene, polycarbonate and polyethylene terephthalate (PET), with the PET film being preferred for appropriate flexibility, mechanical strength and heat resistance. These films may have been pretreated such as by corona treatment or coating of a release agent. Such films are commercially available, for example, Cerapeel® WZ(RX) and Cerapeel® BX8(R) from Toray Advanced Film Co., Ltd.; E7302 and E7304 from Toyobo Co., Ltd.; Purex® G31 and Purex® G71T1 from Teijin DuPont Films Japan Ltd.; and PET 38×1-A3, PET38×1-V8 and PET38×1-X08 from Nippa Co., Ltd.

The protective film used in the photosensitive dry film may be similar to the support film. Among others, PET and polyethylene films having an appropriate flexibility are preferred. Such films are also commercially available. For example, PET films are as mentioned above, and polyethylene films include GF-8 from Tamapoly Co., Ltd. and PE film 0 type from Nippa Co., Ltd.

Both the support and protective films preferably have a thickness of 10 to 100 μm, more preferably 25 to 50 μm, for consistent manufacture of photosensitive dry film, and prevention of wrapping or curling on a take-up roll.

Pattern Forming Process using Photosensitive Dry Film

A further embodiment of the invention is a pattern forming process comprising the steps of:

(i') using the photosensitive dry film to form the photosensitive resin coating on a substrate, (ii) exposing the photosensitive resin coating to radiation to define exposed and unexposed regions, (iii) developing the exposed resin coating in a developer to dissolve away the unexposed region of the resin coating and to form a pattern of the resin coating.

In step (i'), the photosensitive dry film is used to form the photosensitive resin coating on a substrate. Specifically, the photosensitive dry film at its photosensitive resin coating is attached to a substrate to form the photosensitive resin coating on the substrate. When the photosensitive dry film is covered with the protective film, the dry film at its photosensitive resin coating is attached to a substrate after stripping the protective film therefrom, to form the photosensitive resin coating on the substrate. The dry film may be attached, for example, using a film attachment apparatus.

The substrate used herein may be the same as described above in the section of the pattern forming process using the photosensitive resin composition. The film attachment apparatus is preferably a vacuum laminator. The photosensitive dry film is mounted in the film attachment apparatus where the protective film is stripped from the dry film. In the vacuum chamber kept at a predetermined vacuum, the bare photosensitive resin coating of the dry film is closely bonded to the substrate on a table at a predetermined temperature, using a bonding roll under a predetermined pressure. Preferably, the temperature is 60 to 120° C. the pressure is 0 to 5.0 MPa, and the vacuum is 50 to 500 Pa.

The attachment of dry film may be repeated plural times, if necessary to obtain a photosensitive resin coating having the desired thickness. The attachment step is repeated 1 to 10 times, for example, before a photosensitive resin coating having a thickness of the order of 10 to 1,000 μm, preferably 100 to 500 μm is obtained.

The assembly of the photosensitive resin coating on the substrate may be prebaked, if necessary, for facilitating photo-cure reaction of the photosensitive resin coating or enhancing the adhesion between the resin coating and the substrate. Prebake may be, for example, at 40 to 140° C. for 1 minute to 1 hour.

Like the pattern forming process using the photosensitive resin composition, the photosensitive resin coating attached to the substrate may be subjected to steps of (ii) exposing the photosensitive resin coating to radiation, (iii) developing the exposed resin coating in a developer to dissolve away the unexposed region of the resin coating and to form a pattern of the resin coating, and optionally (iv) post-curing the patterned coating. It is noted that the support of the photosensitive dry film may be removed before prebake or before PEB, by mechanical stripping or the like, depending on a particular process.

The photosensitive resin coating obtained from the photosensitive resin composition or photosensitive dry film has improved properties including heat resistance, flexibility, electric insulation, mechanical properties, and substrate adhesion. The resin coating is thus suited as a film for protecting electric/electronic parts such as semiconductor chips or a film for bonding substrates.

EXAMPLES

Examples of the invention are given below by way of illustration and not by way of limitation. Notably, the weight average molecular weight (Mw) is measured by gel permeation chromatography (GPC) versus monodisperse polystyrene standards using GPC column TSKgel Super HZM-H (Tosoh Corp.) under analytical conditions: flow rate 0.6 mL/min, tetrahydrofuran elute, and column temperature 40° C.

The compounds used in Synthesis Examples are shown below.

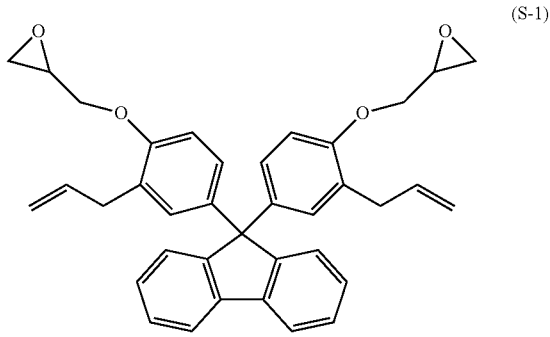

(S-1)

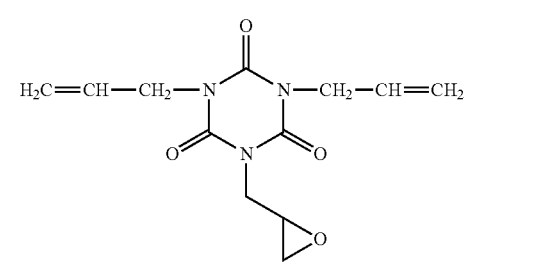

(S-2)

-continued

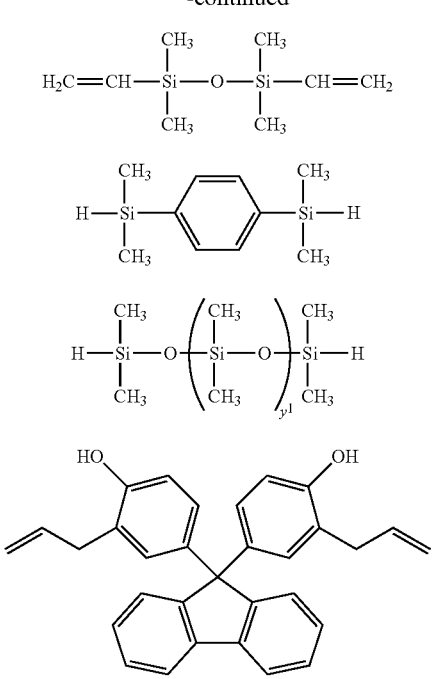

(S-3), (S-4), (S-5), (S-6)

[1] Synthesis of Silicone Resin

Synthesis Example 1

A 3-L flask equipped with a stirrer, thermometer, nitrogen purge line and reflux condenser was charged with 78.4 g (0.20 mol) of compound having formula (S-1), 129.0 g (0.30 mol) of compound having formula (S-6) and 2,000 g of toluene and heated at 70° C. Thereafter, 1.0 g of a toluene solution of chloroplatinic acid (platinum concentration 0.5 wt %) was added, and 67.9 g (0.35 mol) of compound having formula (S-4) and 453.0 g (0.15 mol) of compound having formula (S-5) wherein y=40 (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin 1. On $^1$H-NMR spectroscopy (Bruker Corp.), Resin 1 was identified to contain recurring units (a1), (a2), (b1) and (b2). Resin 1 had a Mw of 62,000 and a silicone content of 62.2 wt %.

Synthesis Example 2

A 3-L flask equipped with a stirrer, thermometer, nitrogen purge line and reflux condenser was charged with 39.75 g (0.15 mol) of compound having formula (S-2), 117.6 g (0.30 mol) of compound having formula (S-1), 21.5 g (0.05 mol) of compound having formula (S-6), and 2,000 g of toluene and heated at 70° C. Thereafter, 1.0 g of a toluene solution of chloroplatinic acid (platinum concentration 0.5 wt %) was added, and 48.5 g (0.25 mol) of compound having formula (S-4) and 755.0 g (0.25 mol) of compound having formula (S-5) wherein y=40 (Shin-Etsu Chemical Co., Ltd.) were added dropwise over 1 hour. The molar ratio of the total amount of hydrosilyl groups to the total amount of alkenyl goups was 1/1. At the end of dropwise addition, the reaction solution was heated at 100° C. and aged for 6 hours. Toluene was distilled off in vacuum from the reaction solution, yielding Resin 2. On $^1$H-NMR spectroscopy (Bruker Corp.), Resin 2 was identified to contain recurring units (a1), (a3) (a4) (b3) and (b4). Resin 2 had a Mw of 83,000 and a silicone content of 76.9 wt %.

Synthesis Example 3

A 3-L flask equipped with a stirrer, thermometer, nitrogen purge line and reflux condenser was charged with 27.9 g (0.15 mol) of compound having formula (S-3), 19.6 g (0.05 mol) of compound having formula (S-1), 129.0 g (0.30 mol) of compound having formula (S-6), and 2,000 g of toluene and heated at 70° C. Thereafter, 1.0 g of a toluene solution of chloroplatinic acid (platinum concentration 0.5 wt %) was added, and 87.3 g (0.45 mol) of compound having formula (S-4) and 79.3 g (0.05 mol) of compound having formula (S-5) wherein y=20 (Shin-Etsu Chemical Co., Ltd.) were added dropwise over 1 hour. The molar ratio of the total amount of hydrosilyl groups to the total amount of alkenyl groups was 1/1. At the end of dropwise addition, the reaction solution was heated at 100° C. and aged for 6 hours. Toluene was distilled off in vacuum from the reaction solution, yielding Resin 3. On $^1$H-NMR spectroscopy (Bruker Corp.), Resin 3 was identified to contain recurring units (a1), (a2), (a4), (b1), (b2) and (b4). Resin 3 had a Mw of 24,000 and a silicone content of 31.2 wt %.

[2] Preparation of Photosensitive Resin Composition

Examples 1 to 12 and Comparative Examples 1 to 21

Photosensitive resin compositions were prepared by combining the resin (in each Synthesis Example), photoacid generator, cure promoter, crosslinker, and solvent in accordance with the formulation shown in Tables 1 to 3, agitating and mixing them at room temperature until dissolution, and precision filtering through a Teflon® filter with a pore size of 1.0 μm.

TABLE 1

| Component (pbw) | | Example | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| (A) Resin | Resin 1 | 100 | | | 100 | | | 100 | | | 100 | | |
| | Resin 2 | | 100 | | | 100 | | | 100 | | | 100 | |
| | Resin 3 | | | 100 | | | 100 | | | 100 | | | 100 |
| (B) Photoacid generator | PAG-1 | 1 | 1 | 1 | 1 | 1 | 1 | 1 | 1 | 1 | 1 | 0.1 | 5 |
| (C) Cure promoter | C-1 | 0.05 | | | | 3 | | | | 1 | | | |
| | C-2 | | 0.05 | | | | 3 | | | | 1 | | |
| | C-3 | | | 0.05 | | | | 3 | | | | 1 | |
| | C-4 | | | | 0.05 | | | | 3 | | | | 1 |

TABLE 1-continued

| Component (pbw) | | 1 | 2 | 3 | 4 | 5 | 6 | 7 | 8 | 9 | 10 | 11 | 12 |
|---|---|---|---|---|---|---|---|---|---|---|---|---|---|
| | | | | | | Example | | | | | | | |
| (D) Crosslinker | CL-1 | 10 | | 10 | | | 10 | | 10 | 50 | | 10 | |
| | CL-2 | | 10 | | 10 | 10 | | 10 | | | 1 | | 10 |
| (E) Solvent | cyclopentanone | 55 | 55 | 55 | 55 | 55 | 55 | 55 | 55 | 55 | 55 | 55 | 55 |

TABLE 2

| Component (pbw) | | 1 | 2 | 3 | 4 | 5 | 6 | 7 | 8 | 9 | 10 | 11 |
|---|---|---|---|---|---|---|---|---|---|---|---|---|
| | | | | | | Comparative Example | | | | | | |
| (A) Resin | Resin 1 | 100 | | | 100 | | | 100 | | | 100 | |
| | Resin 2 | | 100 | | | 100 | | | 100 | | | 100 |
| | Resin 3 | | | 100 | | | 100 | | | 100 | | |
| (B) Photoacid generator | PAG-1 | 1 | 1 | 1 | 1 | 1 | 1 | 1 | 1 | 1 | 1 | 1 |
| (C) Cure promoter | C-5 | | 0.05 | | | | | | | | 3 | |
| | C-6 | | | 0.05 | | | | | | | | 3 |
| | C-7 | | | | 0.05 | | | | | | | |
| | C-8 | | | | | 0.05 | | | | | | |
| | C-9 | | | | | | 0.05 | | | | | |
| | C-10 | | | | | | | 0.05 | | | | |
| | C-11 | | | | | | | | 0.05 | | | |
| | C-12 | | | | | | | | | 0.05 | | |
| (D) Crosslinker | CL-1 | 10 | 10 | | 10 | | 10 | | 10 | | | 10 |
| | CL-2 | | | 10 | | 10 | | 10 | | 10 | 10 | |
| (E) Solvent | cyclopentanone | 55 | 55 | 55 | 55 | 55 | 55 | 55 | 55 | 55 | 55 | 55 |

TABLE 3

| Component (pbw) | | 12 | 13 | 14 | 15 | 16 | 17 | 18 | 19 | 20 | 21 |
|---|---|---|---|---|---|---|---|---|---|---|---|
| | | | | | | Comparative Example | | | | | |
| (A) Resin | Resin 1 | | 100 | | 100 | | 100 | | | | |
| | Resin 2 | | | 100 | | 100 | | 100 | | | |
| | Resin 3 | 100 | | | | | | | 100 | 100 | 100 |
| (B) Photoacid generator | PAG-1 | 1 | 1 | 1 | 1 | 1 | 1 | 1 | 1 | 0.1 | 5 |
| (C) Cure promoter | C-5 | | | | | | | 1 | | | |
| | C-6 | | | | | | | | | | |
| | C-7 | 3 | | | | | | | 1 | | |
| | C-8 | | 3 | | | | | | | | |
| | C-9 | | | 3 | | | | | | 1 | |
| | C-10 | | | | 3 | | | | | | |
| | C-11 | | | | | 3 | | | | | 1 |
| | C-12 | | | | | | 3 | | | | |
| (D) Crosslinker | CL-1 | | 10 | | 10 | | 10 | 50 | | 10 | |
| | CL-2 | 10 | | 10 | | 10 | | | 1 | | 10 |
| (E) Solvent | cyclopentanone | 55 | 55 | 55 | 55 | 55 | 55 | 55 | 55 | 55 | 55 |

In Tables 1 to 3, photoacid generator PAG-1 is identified below.

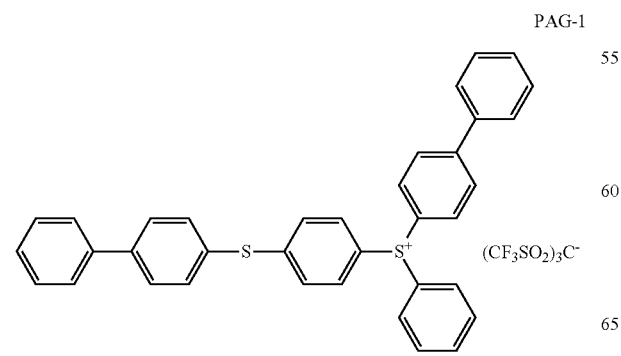

PAG-1

In Tables 1 to 3, crosslinkers CL-1 and CL-2 are identified below.
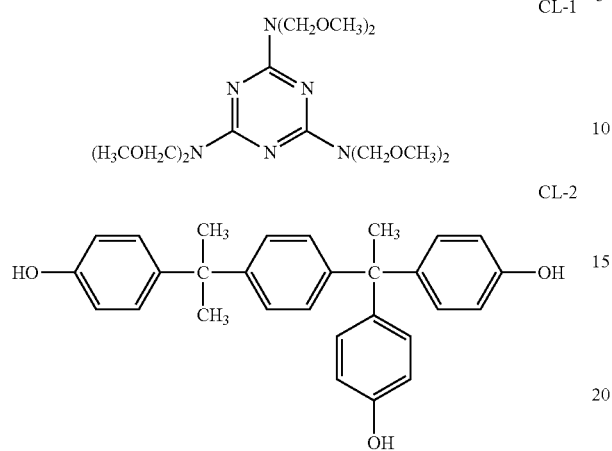
In Tables 1 to 3, cure promoters C-1 to C-12 are identified below.
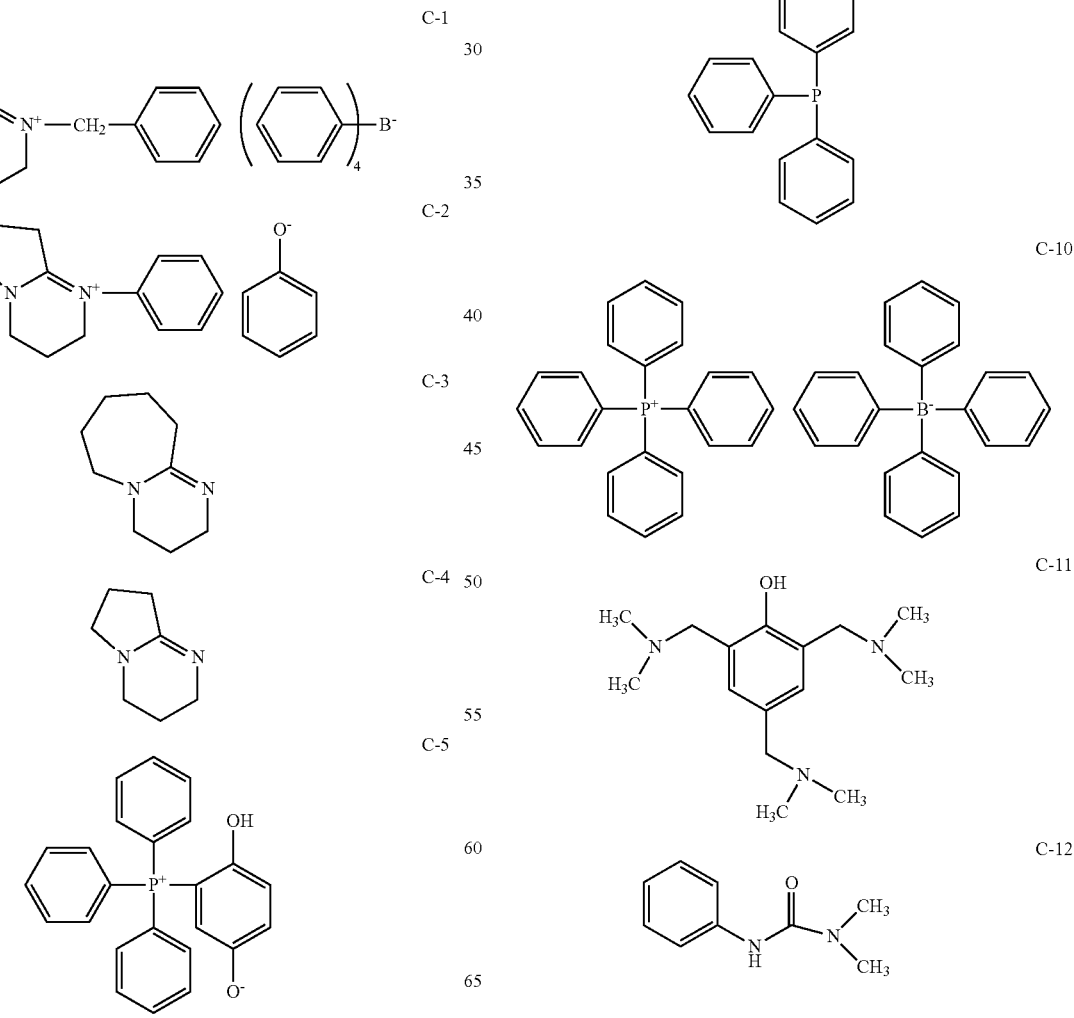
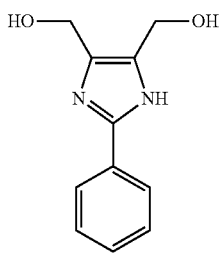
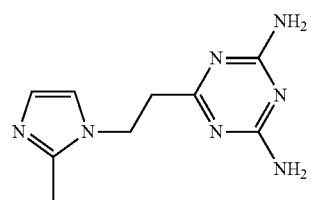
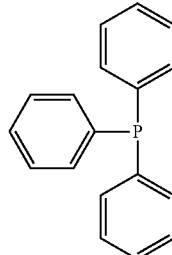
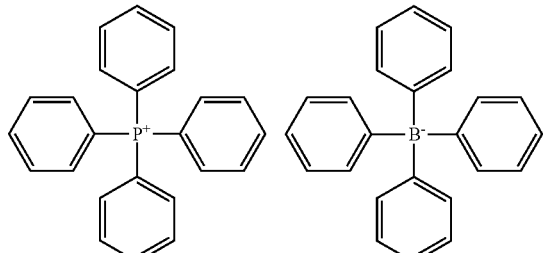
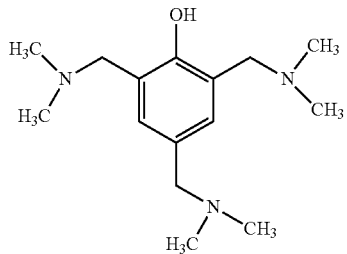
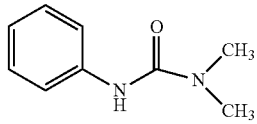

[3] Preparation of Photosensitive Dry Film

A die coater was used as the film coater and a polyethylene terephthalate (PET) film of 38 μm thick used as the support film. Each of the photosensitive resin compositions in Tables 1 to 3 was coated onto the support film. The coated film was passed through a hot air circulating oven (length 4 m) set at 100° C. over 5 minutes to form a photosensitive resin coating on the support film, yielding a photosensitive dry film. Using a laminating roll, a polyethylene film of 50 μm thick as the protective film was bonded to the photosensitive resin coating under a pressure of 1 MPa, yielding a protective film-bearing photosensitive dry film. The thickness of each photosensitive resin coating is tabulated in Tables 4 to 6. The thickness of a resin coating was measured by an optical interference film thickness gauge.

[4] Evaluation of Resin Coating (1) Pattern Formation and Evaluation

From the protective film-bearing photosensitive dry film, the protective film was stripped off. Using a vacuum laminator TEAM-100 RF (Takatori Corp.) with a vacuum chamber set at a vacuum of 80 Pa, the photosensitive resin coating on the support film was closely bonded to a migration test sr bstrate (comb-shaped electrode-bearing substrate, conductor: copper, conductor spacing and width: 20 μm, conductor thickness: 4 μm). The temperature was 110° C. After restoration of atmospheric pressure, the substrate was taken out of the laminator, and the support film was stripped off. Then the photosensitive resin coating was prebaked on a hot plate at 130° C. for 5 minutes for enhancing its adhesion to the substrate.

Next, using a contact aligner exposure tool, the photosensitive resin coating was exposed to radiation of 405 nm through a mask having a line-and-space pattern and a contact hole pattern. After exposure, the coated substrate was baked (PEB) on a hot plate at 120° C. for 5 minutes and cooled. This was followed by spray development in propylene glycol monomethyl ether acetate (PGMEA) for 300 seconds for forming a pattern of the resin coating. Notably, pattern formation was after a lapse of 1 day from the preparation of the dry film.

The patterned photosensitive resin coating on the substrate was post-cured in an oven at 150° C. for 4 hours while the oven was purged with nitrogen. Under a scanning electron microscope (SEM), the contact hole patterns of 100 μm, 80 μm, 60 μm, 40 μm, and 20 μm were observed in cross section, with the diameter of the minimum hole which extended down to the turn bottom being reported as maximum resolution. A pattern of 300 holes was rated "separated" when one or more hole areas separated from the substrate.

Also, the photosensitive dry film was held under light-shielded conditions at room temperature (25° C.) for 60 days, before a pattern was similarly formed. The patterned photosensitive resin coating on the substrate was post-cured in an oven at 150° C. for 4 hours while the oven was purged with nitrogen. Under SEM, the contact hole patterns of 100 μm, 80 μm, 60 μm, 40 μm, and 20 μm were observed in cross section, with the diameter of the minimum hole which extended down to the film bottom being reported as maximum resolution. A pattern with opening failure was rated poor (X).

(2) Evaluation of Copper Migration

A photosensitive resin coating-bearing copper migration test substrate prepared in (1) was subjected to a copper migration test. The test conditions included temperature 85° C., humidity 85%, and applied voltage 10 volts. The time when short-circuiting occurred was recorded, with the upper limit being set 1,000 hours.

(3) Evaluation of Dielectric Breakdown Strength

For the evaluation of dielectric breakdown strength of a photosensitive resin coating, each of the photosensitive resin compositions of Examples 1 to 12 and Comparative Examples 1 to 21 was coated onto a steel plate of 13 cm×15 cm×0.7 mm (thick) by means of a bar coater and heated in an oven at 150° C. for 4 hours to form a photosensitive resin coating. The resin composition was coated such that the resulting coating had a thickness of 0.2 μm. The resin coating was tested by a breakdown tester TM-5031AM (Tama Densoku Co., Ltd.) to determine the dielectric breakdown strength thereof. Ideally, the dielectric protective film should have a dielectric breakdown strength of 500 V/μm or higher.

(4) Evaluation of Solvent Resistance

To examine the solvent resistance of a photosensitive resin coating, especially resistance to NMP which is frequently used in the fabrication of semiconductor chips, a pattern of 15 mm×15 mm was formed on a silicon wafer from each composition by the same procedure, as in (1). The pattern-bearing wafer was immersed in NMP at room temperature for 1 hour, after which it was examined for a film thickness change and outer appearance for evaluating solvent resistance. The sample was rated good (O) when no changes of film thickness and appearance were observed, and poor (X) when swell and any fault were observed.

(5) Evaluation of Adhesion

For evaluating the ability of photosensitive resin coating to establish a bond between substrates, each of the photosensitive dry films using the photosensitive resin compositions in Examples 1 to 12 and Comparative Examples 1 to 21 was attached to a untreated 8-inch silicon wafer by means of a vacuum laminator. The thickness of the resin coating is shown in Tables 4 to 6. The assembly was prebaked to form a photosensitive resin coating on the wafer.

Next, using a contact aligner exposure tool MA-8 (SUSS MicroTec SE) without a quartz mask, the photosensitive resin coating was exposed to radiation. After the exposure, the silicon wafer was PEB on a hotplate at 130° C. for 5 minutes. The silicon wafer was then attached to an untreated 8-inch quartz glass wafer or Tempax® glass and heated on a hotplate at 160° C. for 5 minutes to establish a temporary bond. The assembly was then post-cured in an oven at 150° C. for 4 hours to form a bond layer between the substrates. The wafer as bonded was heated again in an oven at 220° C. for 3 hours while purging with nitrogen. It was observed whether or not any defects were induced in the bond layer by heating.

The results are shown in Tables 4 to 6.

TABLE 4

| | | Example | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| Thickness of photosensitive resin coating (μm) | | 100 | 100 | 100 | 100 | 100 | 100 | 100 | 100 | 100 | 100 | 100 | 100 |
| After | Maximum resolution (μm) | 60 | 60 | 60 | 60 | 60 | 60 | 60 | 60 | 60 | 60 | 60 | 60 |

TABLE 4-continued

| | | Example | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| 1 day | Separated areas | | | | | | not separated | | | | | | |
| After | Maximum resolution (μm) | 60 | 60 | 60 | 60 | 60 | 60 | 60 | 60 | 60 | 60 | 60 | 60 |
| 60 days | Separated areas | | | | | | not separated | | | | | | |
| Solvent resistance | | ○ | ○ | ○ | ○ | ○ | ○ | ○ | ○ | ○ | ○ | ○ | ○ |
| Dielectric breakdown strength (V/μm) | | 585 | 590 | 595 | 560 | 575 | 570 | 595 | 585 | 590 | 595 | 580 | 570 |
| Cu migration test (shortcircuiting time, hr) | | | | | | | 1000 hr (no shortcircuiting) | | | | | | |
| Bond defects | | no | no | no | no | no | no | no | no | no | no | no | no |

TABLE 5

| | Comparative Example | | | | | | | | | | |
|---|---|---|---|---|---|---|---|---|---|---|---|
| | 1 | 2 | 3 | 4 | 5 | 6 | 7 | 8 | 9 | 10 | 11 |
| Thickness of photosensitive resin coating (μm) | 100 | 100 | 100 | 100 | 100 | 100 | 100 | 100 | 100 | 100 | 100 |
| After 1 day  Maximum resolution (μm) | 100 | 100 | 100 | 100 | 100 | 100 | 100 | 100 | 100 | 100 | 100 |
| After 1 day  Separated areas | | | | | | separated | | | | | |
| After 60 days  Maximum resolution (μm) | X | X | X | X | X | X | X | X | X | X | X |
| After 60 days  Separated areas | | | | | | separated | | | | | |
| Solvent resistance | ○ | ○ | ○ | ○ | ○ | ○ | ○ | ○ | ○ | ○ | ○ |
| Dielectric breakdown strength (V/μm) | 300 | 320 | 310 | 400 | 360 | 375 | 305 | 320 | 365 | 320 | 325 |
| Cu migration test (shortcircuiting time, hr) | 200 | 200 | 200 | 200 | 200 | 200 | 200 | 200 | 200 | 200 | 200 |
| Bond defects | induced | induced | induced | induced | induced | induced | induced | induced | induced | induced | induced |

TABLE 6

| | Comparative Example | | | | | | | | | |
|---|---|---|---|---|---|---|---|---|---|---|
| | 12 | 13 | 14 | 15 | 16 | 17 | 18 | 19 | 20 | 21 |
| Thickness of photosensitive resin coating (μm) | 100 | 100 | 100 | 100 | 100 | 100 | 100 | 100 | 100 | 100 |
| After 1 day  Maximum resolution (μm) | 100 | 100 | 100 | 100 | 100 | 100 | 100 | 100 | 100 | 100 |
| After 1 day  Separated areas | | | | | separated | | | | | |
| After 60 days  Maximum resolution (μm) | X | X | X | X | X | X | X | X | X | X |
| After 60 days  Separated areas | | | | | separated | | | | | |
| Solvent resistance | ○ | ○ | ○ | ○ | ○ | ○ | ○ | ○ | ○ | ○ |
| Dielectric breakdown strength (V/μm) | 340 | 385 | 320 | 360 | 355 | 360 | 375 | 320 | 305 | 310 |
| Cu migration test (shortcircuiting time, hr) | 200 | 200 | 200 | 200 | 200 | 200 | 200 | 200 | 200 | 200 |
| Bond defects | induced | induced | induced | induced | induced | induced | induced | induced | induced | induced |

As is evident from the test results, the photosensitive resin compositions and dry films within the scope of the invention are shelf stable and have satisfactory photosensitive material properties in that a resin coating thereof can be readily processed in thick film form to form a fine size pattern. The photosensitive resin coating obtained therefrom has high chemical resistance to photoresist strippers, as well as improved adhesion, electrical insulation, and copper migration resistance, and is fully reliable as an insulating protective film. The photosensitive resin composition is thus useful as a material for forming protective film for protecting electrical/electronic parts such as circuit substrates, semiconductor chips and display devices. Thus photosensitive resin compositions and photosensitive dry films having more reliability are available.

Japanese Patent Application No. 2018-193949 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A photosensitive resin composition comprising (A) a silicone resin containing an epoxy and/or phenolic hydroxyl group, (B) a photoacid generator, and (C) at least one cure promoter selected from diazabicycloundecene, diazabicyclononene, an organic salt having a diazabicycloundecene derivative as a cation species, and an organic salt having a diazabicyclononene derivative as a cation species.

2. The photosensitive resin composition of claim 1 wherein the silicone resin (A) comprises recurring units having the formulae (a1) to (a4) and (b1) to (b4):

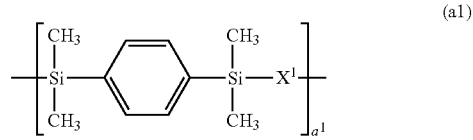

(a1)

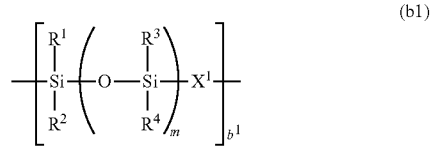

(b1)

-continued (a2)
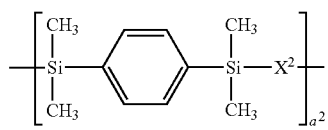

(b2)
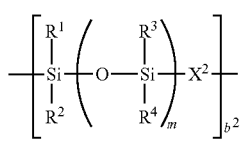

(a3)
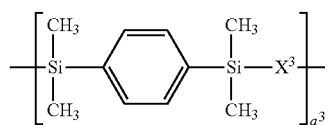

(b3)
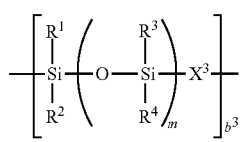

(a4)
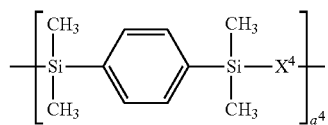

(a4)
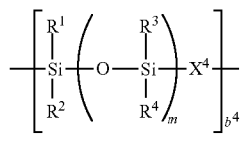

wherein $R^1$ to $R^4$ are each independently a $C_1$-$C_8$ monovalent hydrocarbon group, m is an integer of 1 to 600, $a^1$ to $a^4$ and $b^1$ to $b^4$ are numbers in the range: $0 \leq a^1 < 1$, $0 \leq a^2 < 1$, $0 \leq a^3 < 1$, $0 \leq a^4 < 1$, $0 \leq b^1 < 1$, $0 \leq b^2 < 1$, $0 \leq b^3 < 1$, $0 \leq b^4 < 1$, $0 < a^1 + a^2 + a^3 < 1$, $0 < b^1 + b^2 + b^3 < 1$, and $a^1 + a^2 + a^3 + a^4 + b^1 + b^2 + b^3 + b^4 = 1$, $X^1$ is a divalent group having the formula (X1):

(X1)
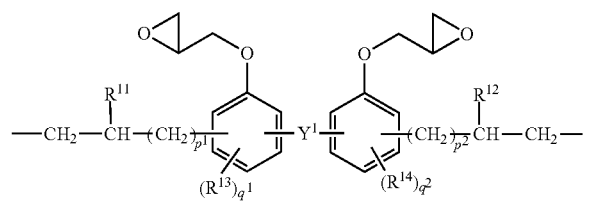

wherein $Y^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently $C_1$-$C_4$ alkyl or $C_1$-$C_4$ alkoxy, $p^1$ and $p^2$ are each independently an integer of 0 to 7, $q^1$ and $q^2$ are each independently an integer of 0 to 2, $X^2$ is a divalent group having the formula (X2):

(X2)
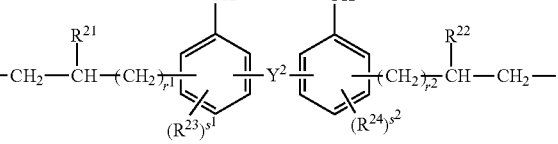

wherein $Y^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently $C_1$-$C_4$ alkyl or $C_1$-$C_4$ alkoxy, $r^1$ and $r^2$ are each independently an integer of 0 to 7, $s^1$ and $s^2$ are each independently an integer of 0 to 2, $X^3$ is a divalent group having the formula (X3):

(X3)
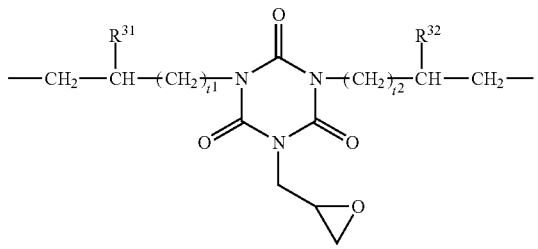

wherein $R^{31}$ and $R^{32}$ are each independently hydrogen or methyl, $t^1$ and $t^2$ are each independently an integer of 0 to 7, $X^4$ is a divalent group having the formula (X4):

(X4)
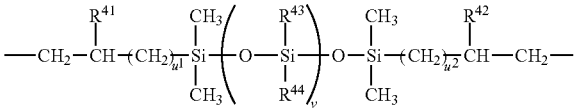

wherein $R^{41}$ and $R^{42}$ are each independently hydrogen or methyl, $R^{43}$ and $R^{44}$ are each independently a $C_1$-$C_8$ monovalent hydrocarbon group, $u^1$ and $u^2$ are each independently an integer of 0 to 7, v is an integer of 0 to 600.

3. The photosensitive resin composition of claim 1, further comprising (D) a crosslinker.

4. The photosensitive resin composition of claim 3 wherein the crosslinker is selected from the group consisting of melamine, guanamine, glycoluril and urea compounds having on the average at least two methylol and/or alkoxymethyl groups in the molecule, amino condensates modified with formaldehyde or formaldehyde-alcohol, phenol compounds having on the average at least two methylol or alkoxymethyl groups in the molecule, and epoxy compounds having on the average at least two epoxy groups in the molecule.

5. The photosensitive resin composition of claim 1, further comprising (E) a solvent.

6. A photosensitive resin coating comprising the photosensitive resin composition of claim 1.

7. A photosensitive dry film comprising a support and the photosensitive resin coating of claim 6 thereon.

8. A pattern forming process comprising the steps of:
(i) coating the photosensitive resin composition of claim 1 onto a substrate to form a photosensitive resin coating thereon,
(ii) exposing the photosensitive resin coating to radiation to define exposed and unexposed regions, and
(iii) developing the exposed resin coating in a developer to dissolve away the unexposed region of the resin coating and to form a pattern of the resin coating.

9. A pattern forming process comprising the steps of:
(i') using the photosensitive dry film of claim 7 to form the photosensitive resin coating on a substrate,
(ii) exposing the photosensitive resin coating to radiation to define exposed and unexposed regions, and
(iii) developing the exposed resin coating in a developer to dissolve away the unexposed region of the resin coating and to form a pattern of the resin coating.

10. The pattern forming process of claim 8, further comprising (iv) post-curing the patterned resin coating resulting from development step (iii) at a temperature of 100 to 250° C.

11. A protective film comprising the photosensitive resin composition of claim 1, wherein the protective film is on an electrical or electronic part.

12. A layer for bonding two substrates comprising the photosensitive resin composition of claim 1.

* * * * *